US009112145B1

(12) United States Patent
Lu et al.

(10) Patent No.: US 9,112,145 B1
(45) Date of Patent: Aug. 18, 2015

(54) RECTIFIED SWITCHING OF TWO-TERMINAL MEMORY VIA REAL TIME FILAMENT FORMATION

(71) Applicant: Crossbar, Inc., Santa Clara, CA (US)

(72) Inventors: Wei Lu, Ann Arbor, MI (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/756,518

(22) Filed: Jan. 31, 2013

(51) Int. Cl.
  *H01L 47/00* (2006.01)
  *H01L 45/00* (2006.01)

(52) U.S. Cl.
  CPC .............. *H01L 45/12* (2013.01); *H01L 45/16* (2013.01)

(58) Field of Classification Search
  CPC .............. H01L 2924/00; H01L 2924/00015; H01L 2924/13091; H01L 2224/48091; H01L 2224/13144; H01L 2924/12041; H01L 2224/05638; H01L 2224/13147; H01L 2224/45144; H01L 2224/48465; H01L 2224/73104
  USPC .......... 257/2–5, 315, 776, E45.002, E29.002; 438/102, 104, 382
  See application file for complete search history.

(56) References Cited

U.S. PATENT DOCUMENTS

| | | |
|---|---|---|
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Jian Hu et al., "Area-Dependent Switching in Thin Film-Silicon Devices", Materials Research Society Proceedings, 2003, pp. Al8.3.1-Al8.3.6, vol. 762, No. 1, Cambridge University Press.

(Continued)

*Primary Examiner* — Mark A Laurenzi
(74) *Attorney, Agent, or Firm* — Amin, Turocy & Watson, LLP

(57) ABSTRACT

Providing for rectified-switching of a two-terminal solid state memory cell is described herein. By way of example, the subject disclosure provides a solid state device exhibiting rectified resistive switching characteristics that can be fabricated with semiconductor fabrication techniques. The solid state device can comprise a metal ion layer adjacent to an electrically resistive diffusion layer, which is at least in part permeable to conductive ions of the metal ion layer. A pair of electrodes can be placed, respectively, on opposite sides of the adjacent ion layer and electrically resistive diffusion layer to facilitate operating on the two-terminal solid state memory cell. In operation, a program voltage induces conductive ions to form a semi-stable conductive filament within the diffusion layer, which partially deforms in response to reduction in the program voltage. A suitable rectifier voltage re-establishes electrical conductivity, with much lower electrical conductivity for voltages lower than the rectifier voltage.

17 Claims, 12 Drawing Sheets

(56) References Cited

U.S. PATENT DOCUMENTS

| | | |
|---|---|---|
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,806,526 B2 | 10/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Nazarian et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0181920 A1* | 8/2006 | Ufert .............................. 365/153 |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |

(56) References Cited

U.S. PATENT DOCUMENTS

| | | |
|---|---|---|
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 10-2011-0014248 A | 2/2011 |
| WO | WO 03/034498 A1 | 4/2003 |
| WO | WO 2009/005699 A1 | 1/2009 |

OTHER PUBLICATIONS

Andre Dehon, "Array-Based Architecture for FET-Based, Nanoscale Electronics", IEEE Transactions on Nanotechnology, Mar. 2003, pp. 23-32, vol. 2, No. 1.

Herb Goronkin et al., "High-Performance Emerging Solid-State Memory Technologies", MRS Bulletin, Nov. 2004, pp. 805-813, www.mrs.org/publications/bulletin.

Gerhard Muller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North-Holland Publishing Company.

J. Campbell Scott, "Is There an Immortal Memory?", www.sciencemag.org, Apr. 2, 2004, pp. 62-63, vol. 304, No. 5667.

S.H. Lee et al., "Full Integration and Cell Characteristics for 64Mb Nonvolatile PRAM", 2004 Symposium on VLSI Technology Digest of Technical Papers, pp. 20-21, 2004 IEEE.

Stephen Y. Chou et al., "Imprint Lithography With 25-Nanometer Resolution", Science, Apr. 5, 1996, pp. 85-87, vol. 272.

S. Zankovych et al., "Nanoimprint Lithography: Challenges and Prospects", Institute of Physics Publishing, Nanotechnology 12, 2001, pp. 91-95.

A. Avila et al., "Switching in Coplanar Amorphous Hydrogenated Silicon Devices", Solid-State Electronics 44, 2000, pp. 17-27.

Jian Hu et al., "Switching and Filament Formation in Hot-Wire CVD P-Type A-Si:H Devices", Science Direct, Thin Solid Films 430, 2003, pp. 249-252, www.sciencedirect.com.

S. Hudgens et al,. "Overview of Phase-Change Chalcogenide Nonvolatile Memory Technology", MRS Bulletin, Nov. 2004, pp. 829-832, www.mrs.org/publications/bulletin.

K. Terabe et al., "Quantized Conductance Atomic Switch", Nature, vol. 433, Jan. 6, 2005, pp. 47-50, www.nature.com/ nature.

Michael Kund et al., "Conductive Bridging RAM (CBRAM): An Emerging Non-Volatile Memory Technology Scalable to Sub 20nm", IEEE, 2005.

W. Den Boer, "Threshold Switching in Hydrogenated Amorphous Silicon", American Institute of Physics, 1982, pp. 812-813.

P.G. Lecomber et al., "The Switching Mechnism in Amorphous Silicon Junctions", Journal of Non-Crystalline Solids 77 & 78, 1985, pp. 1373-1382, North-Holland, Amsterdam.

A. E. Owen et al., "Switching in Amorphous Devices", Int. J. Electronics, 1992, pp. 897-906, vol. 73, No. 5.

M. Jafar et al., "Switching in Amorphous-Silicon Devices", The American Physical Society, 1994, pp. 611-615, vol. 49, No. 19.

Stikeman, Alexandra, "Polymer Memory—The Plastic Path to Beller Data Storage," Technology Review, Sep. 2002, p. 31, www.technology review.com.

Yong Chen et al. "Nanoscale molecular-switch crossbar circuits," Nanotechnology 14, 2003, pp. 462-468, vol. 1.14, Institute of Physics Publishing.

(56) References Cited

OTHER PUBLICATIONS

C.P. Collier et al. "Electronically Configurable Molecular-Based Logic Gates," Science, Jul. 16, 1999, pp. 391-395, vol. 285, No. 5426.
Office Action for U.S. Appl. No. 11/875,541, dated Jul. 22, 2010.
Office Action for U.S. Appl. No. 11/875,541, dated Mar. 30, 2011.
Office Action for U.S. Appl. No. 11/875,541, dated Oct. 5, 2011.
Office Action for U.S. Appl. No. 11/875,541, dated Jun. 8, 2012.
Choi, Jang Wook, "Molecular Electronic Crossbar Memory Circuits", Bistable [2]Rotaxane Based Molecular Electronics: Fundamentals and Applications, Chapter 3, pp. 79-124, Dissertation, California Institute of Technology.
Sung-Hyun Jo et al., "A Silicon-Based Crossbar Ultra-High-Density Non-Volatile Memory", SSEL Annual Report 2007.
International Search Report for PCT/US2009/060023, filed on Oct. 8, 2009.
Waser, R et al., "Nanoionics-based Resistive Switching Memories", Nature Materials, Nov. 2007, pp. 833-835, vol. 6.
Written Opinion of the International Searching Authority for PCT/US2009/060023, filed on Oct. 8, 2009.
Ex Parte Quayle Action for U.S. Appl. No. 12/826,653, dated May 8, 2012.
International Search Report for PCT/US2011/040090, filed on Jun. 10, 2011.
Written Opinion of the International Searching Authority for PCT/US2011/040090, filed on Jun. 10, 2011.
Notice of Allowability for U.S. Appl. No. 13/158,231, dated Apr. 17, 2012.
Office Action for U.S. Appl. No. 12/835,704, dated Sep. 21, 2011.
Office Action for U.S. Appl. No. 12/835,704, dated Mar. 1, 2012.
Advisory Action for U.S. Appl. No. 12/835,704, dated Jun. 8, 2012.
International Search Report and Written Opinion for PCT/US2011/046035, filed on Jul. 29, 2011.
Office Action for U.S. Appl. No. 12/861,650, dated Jan. 25, 2012.
Notice of Allowability for U.S. Appl. No. 12/861,650, dated Jun. 19, 2012.
Sung Hyun Jo et al., "Programmable Resistance Switching in Nanoscale Two-Terminal Devices," Supporting Information, Dec. 29, 2008, pp. 1-4, vol. 9. No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., Si-Based Two-Terminal Resistive Switching Nonvolatile Memory, 2008, IEEE.
Sung Hyun Jo et al., "Nanoscale Memristor Device as Synapse in Neuromorphic Systems", Nano Letters, 2010, pp. 1297-1301, pubs.acs.org/NanoLett, A-E, American Chemical Society Publications.
Wei Lu et al., "Nanoelectronics from the bottom up," Nature Materials | Review Articles Insight, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices," 2006.
Sung Hyun Jo et al., "Experimental, Modeling and Simulation Studies of Nanoscale Resistance Switching Devices," 2009, IEEE.
Sung Hyun Jo et al., "Nonvolatile Resistive Switching Devices Based on Nanoscale Metal/Amorphous Silicon/Crystalline Silicon Junctions," Mater. Res. Soc. Symp. Proc., 2007, vol. 997, Materials Research Society.
Sung Hyun Jo et al., "Si Memristive Devices Applied to Memory and Neuromorphic Circuits."
Wei Lu et al., "Supporting Information," 2008.
Sung Hyun Jo et al., "High-Density Crossbar Arrays Based on a Si Memristive System," Nano Letters, 2009, pp. 870-874, vol. 9, No. 2, American Chemical Society Publications.
Sung Hyun Jo et al., "High-Density Crossbar Arrays Based on a Si Memristive System," Supporting Information, 2009, pp. 1-4.
Sung Hyun Jo et al., "Programmable Resistance Switching in Nanoscale Two-Terminal Devices," Nano Letters, 2009, pp. 496-500, vol. 9, No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24, No. 10, Jpn. J. Appl. Phys.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids 115, 1989, pp. 168-170, Elsevier Science Publishers B.V., North-Holland.
A. Moopenn et al., "Programmable Synaptic Devices for Electronic Neural Nets", Control and Computers, 1990, pp. 37-40, vol. 18, No. 2.
P.G. Le Comber, "Present and Future Applications of Amorphous Silicon and Its Alloys", Journal of Non-Crystalline Solids 115, 1989, pp. 1-13, Elsevier Science Publishers B.V., North-Holland.
Hu, J., et. al. "AC Characteristics of Cr/p/sup +/ A-Si:HIV Analog Switching Devices." IEEE Transactions on Electron Devices, Sep. 2000, pp. 1751-1757, vol. 47, No. 9.
Owen, A.E. et al., "New amorphous-silicon electrically programmable nonvolatile switching device," Solid-State and Electron Devices, IEEE Proceedings I, Apr. 1982, pp. 51-54, vol. 129, No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures," Philosophical Magazine B, 1991, pp. 349-369, vol. 63, No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Dong, Y., et al., "Si/a-Si Core/Shell Nanowires as Nonvolatile Crossbar Switches", Nano Letters, Jan. 2008, pp. 386-391, vol. 8, No. 2.
European Search Report for Application No. EP 09 81 9890.6 of Mar. 27, 2012.
D. A. Muller, et al., "The Electronic Structure at the Atomic Scale of Ultrathin Gate Oxides", Nature, Jun. 1998, pp. 758-761, vol. 399, No. 24.
Sune, J. et al., "Nondestructive Multiple Breakdown Events in Very Thin SiO2 Films." Applied Physics Letters, 1989, vol. 55 No. 128.
Herve Marand, "Materials Engineering Science", MESc 5025, Chapter 7, University of Vermont, http://www.files.chem.vt.edu/chemdeptimarand/MEScchap6-1 c.pdf.
Owen, A.E. et al., "Electronic switching in amorphouse silicon devices: properties of the conducting filament", Proceedings of the 5th International Conference on Solid-State and Integrated Circuit Technology, 1998, pp. 830-833.
Jo, Sung Hyun, "Nanoscale Memristive Devices for Memory and Logic Applications", Thesis, University of Michigan, 2010.
Office Action for U.S. Appl. No. 12/894,098, dated Aug. 1, 2012.
Sung Hyun Jo et al., "CMOS Compatible Nanoscale Nonvolatile Resistance Switching Memory," Nano Letters, 2008, pp. 392-397, vol. 8, No. 2, American Chemical Society Publications.
Office Action for U.S. Appl. No. 12/582,086, dated Apr. 19, 2011.
Office Action for U.S. Appl. No. 12/582,086, dated Sep. 6, 2011.
Notice of Allowance for U.S. Appl. No. 12/582,086, dated Oct. 21, 2011.
International Search Report for PCT/US2009/061249, filed on Oct. 20, 2009.
Written Opinion of the International Searching Authority for PCT/US2009/061249, filed on Oct. 20, 2009.
Office Action for U.S. Appl. No. 12/861,650, dated Oct. 16, 2012.
Notice of Allowance for U.S. Appl. No. 12/894,087, dated Oct. 25, 2012.
Notice of Allowance for U.S. Appl. No. 13/149,807, dated Oct. 29, 2012.

(56) References Cited

OTHER PUBLICATIONS

Notice of Allowance for U.S. Appl. No. 12/861,666, dated Nov. 14, 2012.
Office Action for U.S. Appl. No. 13/156,232, dated Nov. 26, 2012.
Notice of Allowance for U.S. Appl. No. 13/290,024, dated Nov. 28, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 12/835,699, dated Aug. 24, 2011.
Notice of Allowance for U.S. Appl. No. 12/835,699, dated Feb. 6, 2012.
Office Action for U.S. Appl. No. 12/833,898, dated Apr. 5, 2012.
European Search Report for Application No. EP 1100 5207.3 of Oct. 12, 2011.
Notice of Allowance for U.S. Appl. No. 12/833,898, dated May 30, 2012.
Notice of Allowance for U.S. Appl. No. 12/939,824, dated May 11, 2012.
Notice of Allowance for U.S. Appl. No. 12/940,920, dated Oct. 5, 2011.
Office Action for U.S. Appl. No. 13/314,513, dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653, dated Apr. 25, 2012.
International Search Report for PCT/US2011/045124, filed on Jul. 22, 2011.
Written Opinion of the international Searching Authority for PCT/US2011/045124, filed on Jul. 22, 2011.
Peng-Heng Chang et al., "Aluminum spiking at contact windows in Al/Ti-W/Si", Appl. Phys. Lett., Jan. 25, 1998, pp. 272-274, vol. 52 No. 4, American Institute of Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 mailed Aug. 8, 2012.
Office Action for U.S. Appl. No. 13/417,135, dated Oct. 9, 2012.
Notice of Allowance for U.S. Appl. No. 13/532,019, dated Nov. 14, 2012.
Office Action for U.S. Appl. No. 13/149,653, dated Nov. 20, 2012.
Office Action of U.S. Appl. No. 13/436,714, dated Dec. 7, 2012.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 13/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.

\* cited by examiner

RECTIFIED SWITCHING OF TWO-TERMINAL MEMORY VIA REAL TIME FILAMENT FORMATION

TECHNICAL FIELD

The subject disclosure relates generally to two-terminal memory cell technology, and more particularly to providing rectified switching for a two-terminal memory cell utilizing a structure that facilitates real-time filament formation.

BACKGROUND

A recent innovation within the field of integrated circuit technology is resistive random access memory (RRAM). While much of RRAM technology is in the development stage, various technological concepts for RRAM have been demonstrated and are in one or more stages of verification to prove or disprove associated theory(ies). Even so, RRAM technology promises to hold substantial advantages over competing technologies in the semiconductor electronics industry.

The inventors of the subject disclosure believe that resistive switching memory cells are a promising technology for further advancements in digital electronics. For instance, the inventors believe that resistive switching elements are viable alternatives to various memory cell technologies, such as metal-oxide semiconductor (MOS) type memory cells employed for electronic storage of digital information. Models of resistive-switching memory devices provide some potential advantages over non-volatile FLASH MOS type transistors, including smaller die size, higher memory density, faster switching (e.g., from a relatively conductive state to a relatively non-conductive state, or vice versa), good data reliability, low manufacturing cost, and others.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure relate to a solid state memory cell. The solid state memory cell can comprise a first electrical conductor that forms a layer of the solid state memory cell and an electrically resistive diffusive medium that forms a second layer of the solid state memory cell. Further, the solid state memory cell can comprise a second electrical conductor that forms a third layer of the solid state memory cell. According to various embodiments, ions of the first electrical conductor are at least in part mobile within the electrically resistive diffusive medium. Moreover, a conductive path can be formed through the diffusive medium between the first electrical conductor and the second electrical conductor in response to application of an electric field across the diffusive medium at a programming voltage Vprogram. In particular aspects, the conductive path can partially diffuse within the diffusive medium forming a diffused path in response to a decrease in magnitude of the electric field, the diffused path having an electrical resistance substantially higher than that of the conductive path. The conductive path can be re-formed subsequently in response to another electric field at a reformation voltage, Vreform, with Vreform<Vprogram.

Methods disclosed herein relate to fabricating a solid state memory cell. In particular aspects, such a method can comprise forming an ion donor layer as a first layer of the solid state memory cell and forming a non-conductive region as a second layer of the solid state memory cell, adjacent to the ion donor layer. Further, the method can comprise forming a pair of electrodes above and below, respectively, the ion donor layer and the non-conductive region. In particular aspects, forming the ion donor layer further comprises selecting a material having ions that are at least in part diffusible within the non-conductive region. Further, the method and solid state memory cell can be characterized such that applying a bias voltage to the solid state memory cell causes a subset of the ions to form a conductive filament through the non-conductive region to one of the pair of electrodes adjacent to the non-conductive region, wherein the conductive filament at least in part deforming near the second electrode in response to reduction in the bias voltage.

In still other aspects of the subject disclosure, provided is an electronic device. The electronic device can comprise an electronic memory unit, further comprising one or more arrays of solid state memory cells configured to store digital information. Particularly, the solid state memory cells can comprise a pair of electrodes respectively configured to conduct electricity at a first electrical resistance and an insulator configured to conduct electricity at a second electrical resistance that is two or more orders of magnitude greater than the first electrical resistance. Further, the solid state memory cells can comprise a semi-stable conductive filament within a portion of the insulator having a low resistance stable state and a high resistance stable state, wherein the semi-stable conductive filament is in the low resistance stable state in response to a bias at the pair of electrodes greater than a read bias (Vread, with Vread chosen to be no less than Vreform) and the semi-stable conductive filament is in the high resistance stable state in response to a bias at the pair of electrodes smaller than the read bias and greater than zero.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

DETAILED DESCRIPTION

Figure 1:
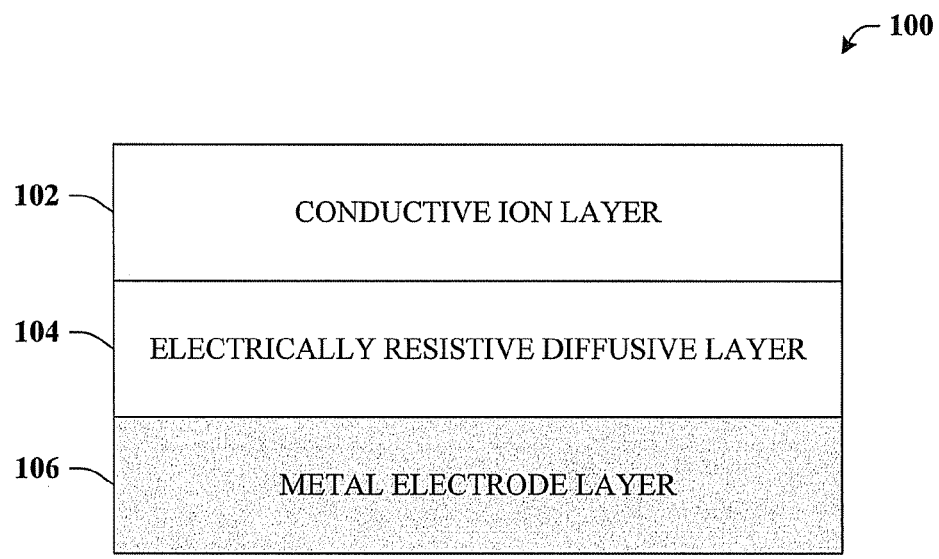
FIG. 1 illustrates a block diagram of an example solid state memory device exhibiting real-time filament formation according to disclosed aspects.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

This disclosure relates to two-terminal memory cells, particularly resistive switching two-terminal memory cells, in various embodiments. Resistive switching two-terminal memory cells (also referred to as resistive switching memory cells), as utilized herein, comprise circuit components having two electrical contacts (also referred to herein as electrodes or terminals) with an active region between the two conductive contacts. The active region of the two-terminal memory device exhibits a plurality of stable or semi-stable resistive states, each resistive state having different electrical resistance. Moreover, respective ones of the plurality of states can be formed or activated in response to a respective voltage difference applied at the two conductive contacts. An example of a resistive switching two-terminal memory device, though not exhaustive, can include a resistive random access memory (RRAM).

The inventors of the present disclosure have studied layered amorphous silicon (a-Si), metal oxides and silicon oxides, as well as other materials. Some resistive-switching devices can have, for example, a three-layer arrangement of metal/insulator/metal. A more particular example can include a-Si resistive switching device having a metal/a-Si/metal arrangement. The a-Si layer essentially serves as a digital information storage medium, and can also be referred to as a resistive switching layer (RSL), resistive switching medium (RSM), or the like.

Resistive-switching memory can include, for example, a filamentary-based memory cell, which in turn can include: a p-type or n-type silicon bearing layer (e.g., p-type or n-type polysilicon, p-type or n-type SiGe), an undoped amorphous silicon layer (e.g., having intrinsic characteristics), and an active metal layer for providing filament forming ions to the amorphous silicon layer (e.g., silver (Ag), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)). In some disclosed embodiments, a memory cell can comprise one or more of the foregoing layers, a subset of these layers, or none of these layers, or other layers detailed herein. Some details pertaining to resistive-switching memory similar to the filamentary-based memory cell example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that a variety of filamentary-based two-terminal memory cell technologies exist, having different physical properties. For instance, different technologies can have different discrete programmable resistances, different associated program/erase voltages, as well as other differentiating characteristics. For instance, a unipolar resistive-switching memory cell, once initially programmed, can be later programmed in response to a first positive voltage (e.g., three volts) and erased in response to a second positive voltage (e.g., between four and five volts). Bipolar resistive-switching memory cells, on the other hand, become programmed in response to a positive voltage and erased in response to a negative voltage. Where no specific resistive-switching technology or program/erase voltage is specified for the various aspects and embodiments herein, it is intended that such aspects and embodiments incorporate any suitable memory cell technology and be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Two-terminal memory cells have several advantages over FLASH or metal oxide semiconductor (MOS) memory devices. For instance, resistive-switching memory technology can generally be smaller, typically consuming silicon area on the order of $4F^2$ per adjacent resistive-switching device (e.g., a memory cell comprising two resistive-switching devices would therefore be approximately $8F^2$ if constructed in adjacent silicon space). Non-adjacent resistive-switching devices, e.g., stacked above or below each other, can consume as little as $4F^2$ for a set of multiple non-adjacent devices. Such can lead to greater semiconductor component density and memory density, and low manufacturing costs for a given number of transistors relative to competing technologies. Resistive-switching memory also has very fast programming and/or switching speed along with a relatively low programming current. Additionally, resistive-switching memory is non-volatile memory, having the capacity to store data without continuous application of power. In addition to the foregoing, two-terminal memory cells can generally be built between metal interconnect layers, enabling two-terminal memory-based devices to be usable for two-dimensional as well as three-dimensional semiconductor architectures.

To program a filamentary-based resistive-switching memory cell, a suitable program voltage Vprogram can be applied across the memory cell causing a conductive filament to form through a resistive, or dielectric, portion of the memory cell. This causes the memory cell to switch from a relatively high resistive state, to a relatively low resistive state. An erase process can be implemented to reverse the process, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time, can in effect facilitate storing binary information. In various embodiments, multi-level information (e.g., multiple bits) may be stored in such memory cells. For various reasons, two-terminal memory cells are generally quick to program and responsive, changing state readily in response to a program voltage. This quick switching of state is a significant advantage of resistive-switching memory cells over other memory cell technologies.

Viewed broadly, two-terminal memory has the potential to replace other types of memory technologies for various memory applications, due to the numerous advantages over competing technologies. However, a significant difficulty that exists with some two-terminal memory cells is the so-called "sneak path problem." A sneak path (also referred to as "leak path") can be characterized by undesired current flowing through neighboring memory cells, which can be particularly evident in large passive memory crossbar arrays, particularly in connection with cells in the "on" state.

In more detail, sneak path current can result from a voltage difference across adjacent or nearby bitlines of a memory array. For instance, in some architectures, a two-terminal memory cell positioned between metal inter-connects (e.g., bitlines and wordlines) of a crossbar array is typically not a true electrical insulator, and thus a small amount of current can flow in response to the aforementioned voltage differences. Further, these small amounts of current can add together, particularly when caused by multiple voltage differences observed across multiple metal inter-connects. During a memory operation, sneak path current(s) can co-exist with an operating signal (e.g., program signal, erase signal, read signal, etc.) and reduce operational margin, for example, the current and/or voltage margin between reading a programmed cell (associated with a first physical state) and an erased cell (associated with a second physical state). For instance, in conjunction with a read operation on a selected memory cell, sneak path current sharing a read path with the selected memory cell can add to a sensing current, reducing sensing margin of read circuitry. In addition to increased power consumption and joule heating, and the detriments related thereto, sneak path currents can lead to memory cell errors—a problem that can undermine reliability in the memory itself.

One way to mitigate the problem of sneak path current is to employ a 1R-1T memory array architecture. The 1T-1R architecture includes a transistor switch with each resistive switching device. The transistor switch can be utilized to deactivate the resistive switching memory device (e.g., isolate from one or more neighboring memory devices) when not selected for a memory operation. The transistor in effect can be turned "off", greatly reducing current flow in series with the resistive switching device, even when the resistive switching device itself is programmed, or in an "on" state (facilitating much higher current flow). However, the 1T-1R model has a cost in power consumption and die size (or memory cells per unit area). An improvement upon the 1T-1R architecture is a 1 T-xR architecture, where x is an integer greater than 1. To accomplish this, a memory cell is combined with some other sneak-path mitigation technique so that multiple resistive switching memory cells can be activated or deactivated by a single transistor (e.g., a select transistor). In various aspects of the subject disclosure, rectified switching is disclosed via real-time filament formation. When formed in response to a program voltage Vprogram, a filament facilitates high electrical conductivity in a memory cell, equated to a program or "on" state. When a voltage applied to the memory cell is reduced in magnitude to the value smaller than that of the program voltage, the conductive filament partially deforms. This partial deformation results in low electrical conductivity (e.g., much lower than the "on" state but similar to or higher than the "off" state) at low voltages. Accordingly, so long as sneak-path related voltages do not exceed a low rectification voltage associated with filament re-formation, sneak-path current can be greatly mitigated by the real-time filament formation, facilitating a 1T-xR memory cell architecture with relatively large 'x' values.

Referring now to the drawings, FIG. 1 illustrates an example solid state memory device that exhibits rectified switching via real-time filament formation, according to various aspects of the subject disclosure. The solid state memory device comprises a stack 100 of multiple solid layers. Particularly, stack 100 can comprise a conductive ion layer 102, an electrically resistive diffusive layer 104 and a metal electrode layer 106.

Conductive ion layer 102 can comprise a conductive metal, having unbound or loosely bound conductive ions. Particularly, these unbound or loosely bound conductive ions should be capable of leaving a boundary of the conductive ion layer 102, for instance in response to an electric field of suitable magnitude. These conductive ions, upon leaving conductive ion layer 102 and entering another entity (e.g., electrically resistive diffusive layer 104), can tend to alter electrical characteristics of the other entity. Particularly, these conductive ions can serve to increase conductivity of the other entity, at least within a vicinity of the displaced ions. Suitable materials for conductive ion layer 102 can vary. On example is silver, also referred to herein in its periodic table form Ag. Another example can include copper (e.g., Cu), and still other examples can include compounds of silver or copper, or the like, or a suitable combination thereof.

Electrically resistive diffusive layer 104 has significantly lower electrical conductivity than conductive ion layer 102. Particularly, electrically resistive diffusive layer 104 can, by itself, serve as a suitable electrical insulator as that term is understood within the art. However, electrically resistive diffusive layer 104 is at least in part permeable to ions of conductive ion layer 102. Such ions, when propelled by a suitable electric field, or voltage (e.g., a program voltage), can therefore enter electrically resistive diffusive layer 104. Upon doing so, in some embodiments, the ions can change the electrical properties of electrically resistive diffusive layer 104. In particular aspects of the subject disclosure, the ions can form an electrical path—or conductive filament—from conductive ion layer 102 through electrically resistive diffusive layer 104, to metal electrode layer 106. This conductive filament can significantly reduce the electrical resistance of electrically resistive diffusive layer 104 between conductive ion layer 102 and metal electrode layer 106.

In some disclosed aspects, a contact layer (not depicted) can be positioned between metal electrode layer 106 and electrically resistive diffusive layer 104. The contact layer can be configured, for instance, to improve physical or electrically continuity between electrically resistive diffusive layer 104 and metal electrode layer 106 (e.g., providing good continuity from electrically resistive diffusive layer 104, to the contact layer, and to metal electrode layer 106). The contact layer can be p-doped silicon in some disclosed aspects (e.g., polysilicon, $Si_xGe_y$—where x and y are suitable positive integers, and so on).

In alternative or additional aspects of the subject disclosure, stack 100 can comprise a barrier layer (not depicted) between conductive ion layer 102 and electrically resistive diffusive layer 104. The barrier layer can be configured to shield electrically resistive diffusive layer 104 from contaminants, oxygen, or the like. In a particular aspect, the barrier layer can be formed from titanium, a titanium oxide, a titanium nitride, or the like. (The barrier layer could be employed for other memory cells disclosed herein, such as memory cell 200, etc.).

Because ions of conductive ion layer 102 are at least in part permeable to electrically resistive diffusive layer 104, when not maintained by an external force to have a particular position or shape within electrically resistive diffusive layer 104, these ions can move about within electrically resistive diffusive layer 104. Near conductive ion layer 102, where a number and density of ions will be relatively large, this mobility of ions may have little practical effect on the modified conductivity of electrically resistive diffusive layer 104, following injection of the ions. However, near metal electrode layer 106 where a number and density of these ions can be quite small, this mobility can substantially sever the electrical connection between conductive ion layer 102 and metal electrode layer 106. Accordingly, when the conductive filament is not actively maintained by a suitable electromotive force (e.g., a read voltage or a voltage greater than Vreform), stack 100 can still have very high electrical resistance between conductive ion layer 102 and metal electrode layer 106. This phenomenon provides stack 100 with the multi-resistive state aspect suitable for a resistive switching memory cell.

However, because the filament partially deforms, a suitable positive voltage greater than zero can be required to re-form a portion of the conductive filament. When not re-formed, electrical resistance of stack 100 between conductive ion layer 102 and metal electrode layer 106 is still very high in relative terms (e.g., see current-voltage response of FIG. 6 and its related description, infra). Thus, even in the presence of a positive voltage less than that required to re-form the conductive filament (hereinafter such a positive voltage will be referred to as a reformation voltage Vreform, which can be equal to or smaller than a read voltage), electrically resistive diffusive layer 104 still maintains high electrical resistance. This provides an inherent positive voltage rectification characteristic, similar to a diode rectifier for positive voltage. Importantly, this positive voltage rectification can greatly mitigate sneak path currents for voltages below the reformation voltage, with impact to memory cell density, power consumption or die size. Accordingly, this can facilitate very large number 'x' of resistive memory cells R in a 1T-xR memory cell architecture, significantly improving upon the problems cited above for the 1T-1R memory cell architecture, while maintaining the advantages thereof.

Electrically resistive diffusive layer 104 can be comprised of various materials. Generally speaking, electrically resistive diffusive layer 104 can be any suitable material having high electrical resistance and having at least partial permeability (e.g., in response to an electric field) to ions of conductive ion layer 102. In addition, the material employed for electrically resistive diffusive layer 104 can be compatible with semiconductor fabrication processes (e.g., stacking, etching, masking, deposition, and so forth). Examples of such a material can include an amorphous silicon (a-Si) material, a chalcogenide, a silicon on glass, an oxide such as titanium oxide (TiOx), tantalum oxide (TaOx), silicon oxide (e.g., $SiO_x$), silicon sub-oxide (e.g. SiOx) or the like, or a suitable combination thereof. In some aspects of the subject disclosure, electrically resistive diffusive layer 104 can be several hundred nanometers or less in thickness. In particular aspects, electrically resistive diffusive layer 104 can be about a hundred nanometers in thickness, or less. In at least one aspect, electrically resistive diffusive layer 104 can be selected from between about fifty nanometers thick and about thirty nanometers thick.

Metal electrode layer 106 can be a suitable metal conductor for a memory cell. Examples can include aluminum, copper, tungsten, titanium, silver, platinum, suitable compounds thereof, or the like, or suitable combinations of the foregoing. In at least one aspect, metal electrode layer 106 can be a metal bitline, metal wordline, metal dataline, or the like, of a memory array. For instance, metal electrode layer 106 can be a metal bitline or metal wordline in a fundamental crossbar memory array (e.g., see FIG. 9 and related description, infra). The general purpose of metal electrode layer 106 is to facilitate memory operations, such as a program operation, read operation, erase operation, and so forth, for a memory cell comprising stack 100. Metal electrode layer 106 can be connected to a sensing circuit (e.g. CMOS circuitry, not depicted) to measure current or voltage of stack 100 in conjunction with reading a state of stack 100, for instance.

Figure 2:
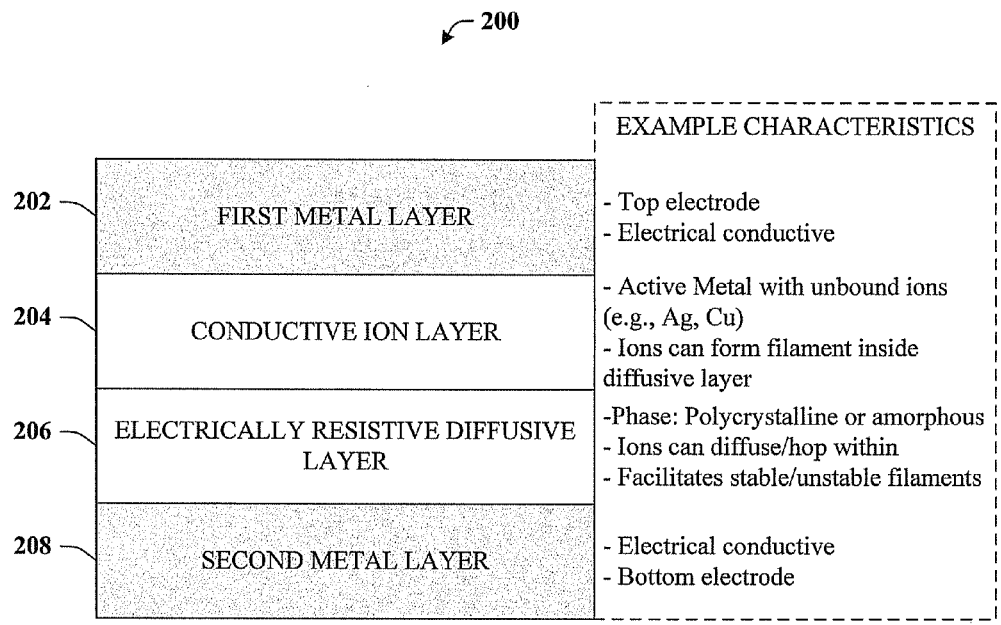
FIG. 2 illustrates a block diagram of the example solid state memory device of FIG. 1 with several associated characteristics.

FIG. 2 illustrates a block diagram of a solid state memory cell 200 according to additional aspects of the subject disclosure. Solid state memory cell 200 can operate as a memory storage device via a resistive switching principle. Moreover, solid state memory cell 200 can have a rectifier property to facilitate reduced sneak path currents. Particularly, the rectifier property can result in a memory cell 200 having a very low current in a programmed state—similar to an erased state current—in response to a voltage across memory cell 200 having a magnitude less than a positive threshold (e.g., a filament re-formation voltage).

Solid state memory cell 200 can comprise a first metal layer 202. First metal layer 202 can serve as one electrode (e.g., a top electrode in a crossbar array) for solid state memory cell 202. The first metal layer 202 is selected to have low electrical resistance/high electrical conductivity. Example materials for the first metal layer 202 can include aluminum, copper, tungsten, titanium, silver, platinum, or similar metals or compounds thereof, or the like, or suitable combinations of the foregoing. Additionally, solid state memory cell 200 can comprise a second metal layer 208. Second metal layer 208 can server as a bottom electrode of solid state memory cell 200 (e.g., a bottom electrode in a crossbar array). Similar to first metal layer 202, second metal layer is configured to have high electrical conductivity/low electrical resistance. Second metal layer can be substantially similar to metal electrode layer 106 of FIG. 1, supra, in some disclosed aspects.

Situated between first metal layer 202 and second metal layer 208 are a conductive ion layer 204 adjacent to an electrically resistive diffusive layer 206. In at least one disclosed aspect, conductive ion layer 204 can be comprised of silver, a suitable silver compound, or another suitable conductor (e.g., copper, and others) or compound thereof, etc. Conductive ion layer 204 can also be referred to as an ion donor layer. In response to a positive voltage applied at first metal layer 202 and second metal layer 208, a force is applied to free ions of conductive ion layer 204, accelerating these ions toward electrically resistive diffusive layer 206, which can comprise a material selected to be permeable to the donor ions of conductive ion layer 204. This permeable material can comprise a polycrystalline material, an a-Si material, a chalcogenide material, a suitable oxide such as $SiO_2$, silicon sub oxide (e.g.

SiOx) or the like. Due to the permeability of electrically resistive diffusive layer 206 with respect to these ions, the ions are forced, e.g. migrate, into the electrically resistive diffusive layer 206 in response to the above positive voltage. In some disclosed aspects, solid state memory cell 200 can be configured such that the positive voltage is a voltage greater than a predetermined voltage, a magnitude of which can be between about 1 and about 5 volts in at least one aspect. In a particular aspect, solid state memory cell 200 can be configured such that the positive voltage is a voltage between about 2.5 and 3 volts (e.g., see FIG. 6 and related description, infra). In various embodiments, as discussed above, a barrier material layer (e.g. titanium) may be disposed between conductive ion layer 204 and resistive diffusive layer 206.

Ions forced into electrically resistive diffusive layer 206 by the positive voltage can form a conductive path between first metal layer 202 and second metal layer 208. Moreover, when the positive voltage decreases beyond a threshold magnitude suitable to sustain the ions in the conductive path, the ions can begin to move throughout the electrically resistive diffusive layer 206. This can result in at least a partial deformation of the conductive path, creating a diffusive path. This diffusive path can have significantly higher electrical resistance than the conductive path, and can require a positive voltage (e.g., Vreform) greater than zero but less than the positive voltage required to form the conductive path from the off state (e.g., Vprogram), to reform the conductive path (low resistance program state) out of the diffusive path (high resistance program state). This positive voltage that reforms the conductive path from the diffusive path is referred to hereinafter as the reformation voltage or rectifier voltage. The positive voltage that forms conductive path without the diffusive path is referred to hereinafter as the program voltage.

Figure 3:
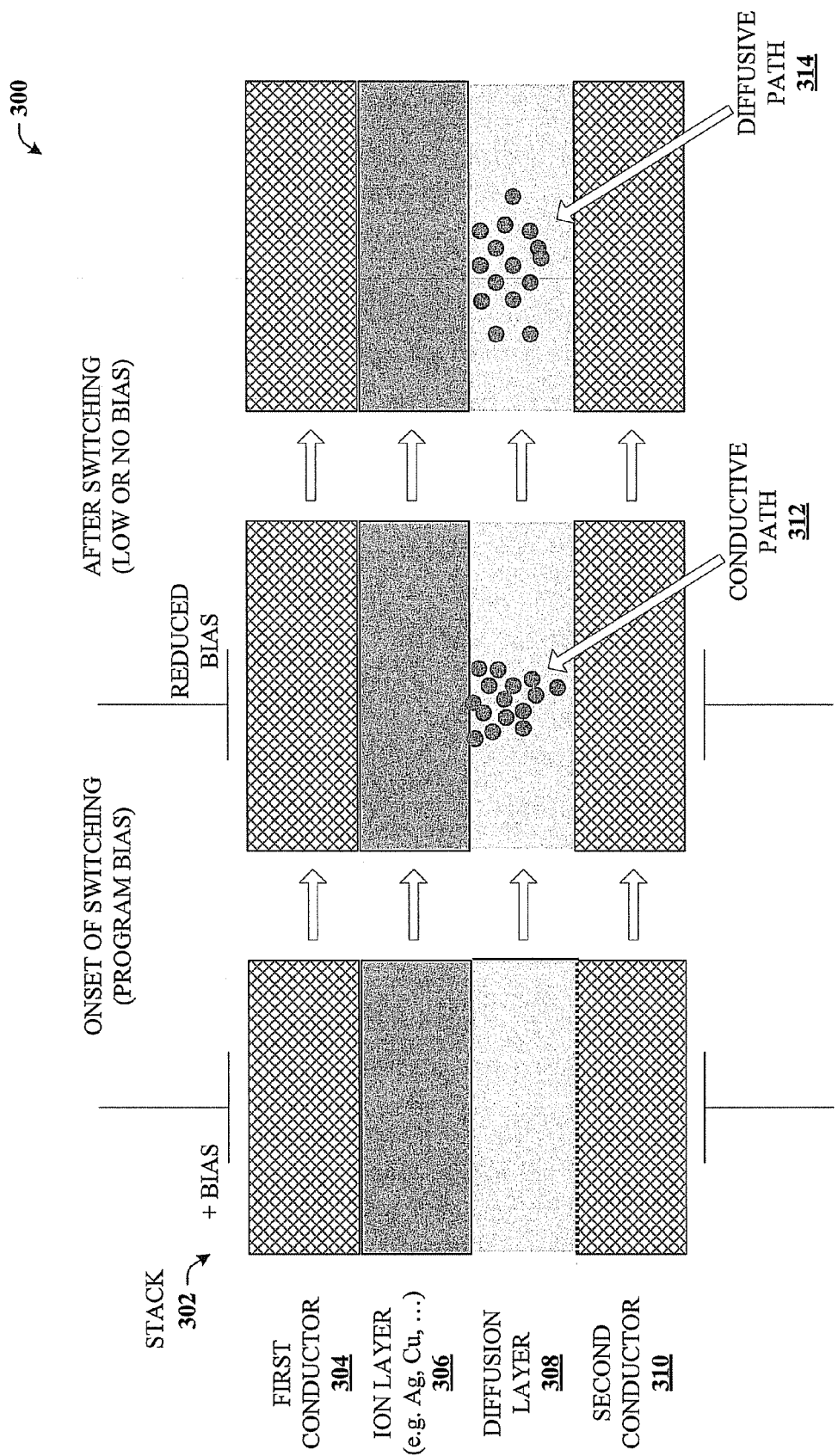
FIG. 3 depicts a block diagram of an example real-time filament formation and partial deformation to facilitate rectified switching in some aspects.

FIG. 3 illustrates a block diagram of an example memory cell configuration 300 in which a solid state memory cell 302 comprises a conductive path and diffusive path according to further aspects of the subject disclosure. Memory cell 302 can be substantially similar to solid state memory cell 200 in some aspects; however the subject disclosure is not limited to these aspects.

As depicted, solid state memory cell 302 can comprise a first conductor 304 depicted by the top cross-checked shaded box, an ion layer 306 depicted by the dark solid shaded box adjacent to the first conductor 304, a diffusion layer 308 depicted by the square-check shaded box adjacent to ion layer 306, and a second conductor 310 indicated by the bottom cross-checked shaded box adjacent to diffusion layer 308. In the state of solid state memory cell 302 depicted on the left hand side of FIG. 3, diffusion layer 308 acts as an electrical insulator for relatively low voltages (e.g., lower than a program voltage). Thus, solid state memory cell 302 is in an "off" or erased state, as the term is utilized for memory cell technology.

At the middle of FIG. 3, solid state memory cell 302 is depicted in a program state. Particularly, a program bias (e.g., having positive polarity) is applied at first conductor 304 relative to second conductor 310. The program voltage forces ions from ion layer 306 into diffusion layer 308 until a conductive path 312 is formed from ion layer 306 to second conductor 310. As is illustrated by this middle depiction of solid state memory cell 302, this conductive path 312 has a relatively large number of ions near ion layer 306 covering a relatively large cross section of diffusion layer 308, as compared with the relatively small number of ions covering a relatively narrow or thin cross section of diffusion layer 308 near second conductor 310. Said differently, conductive path 312 has a wide, stable filament near ion layer 306, and a narrow semi-stable or unstable filament near second conductor 310. However, depending on the bias scheme and the diffusion layer used, the conductive path 312 can have a narrow semi-stable filament near ion layer 306 and a wide, stable filament near second conductor 310. It is assumed that injected ion density near the ion layer is relatively high herein. Regardless of the configuration of the conductive path 312, the operation principle of the device remains the same.

An electric field generated by the program bias can tend to hold ions forming conductive path 312 in relatively stable position within diffusion layer 308, maintaining the conductive path 312. However, when this program bias is reduced such that the electric field is not strong enough to maintain this stable positioning of the ions, the ions will start to drift within diffusion layer 308, turning conductive path 312 into diffusive path 314 depicted on the right side of FIG. 3. Diffusive path 314 has a less defined shape compared with conductive path 312. Though this may not affect conductivity of diffusion layer 308 near ion layer 306, where many ions exist, it can significantly impact conductivity of diffusion layer 308 near second conductor 310. Particularly, diffusive path 314 can have a sufficient lack of ions near second conductor 310 as to greatly reduce electrical continuity between ion layer 306 and second conductor 310. This reduced electrical continuity can result in a current through diffusion path 314 to second conductor 310 that is similar to current when no ions are present within diffusion layer 308 (left-hand side of FIG. 4). However, when the bias across solid state memory cell 302 increases above a reformation bias or rectifier bias, conductive path 312 can be reformed out of diffusive path 314. Note that the reformation bias to reform conductive path 312 from diffusive path 314 can be significantly lower than the program bias required to create conductive path 312 prior to existence of diffusive path 314.

Figure 4:
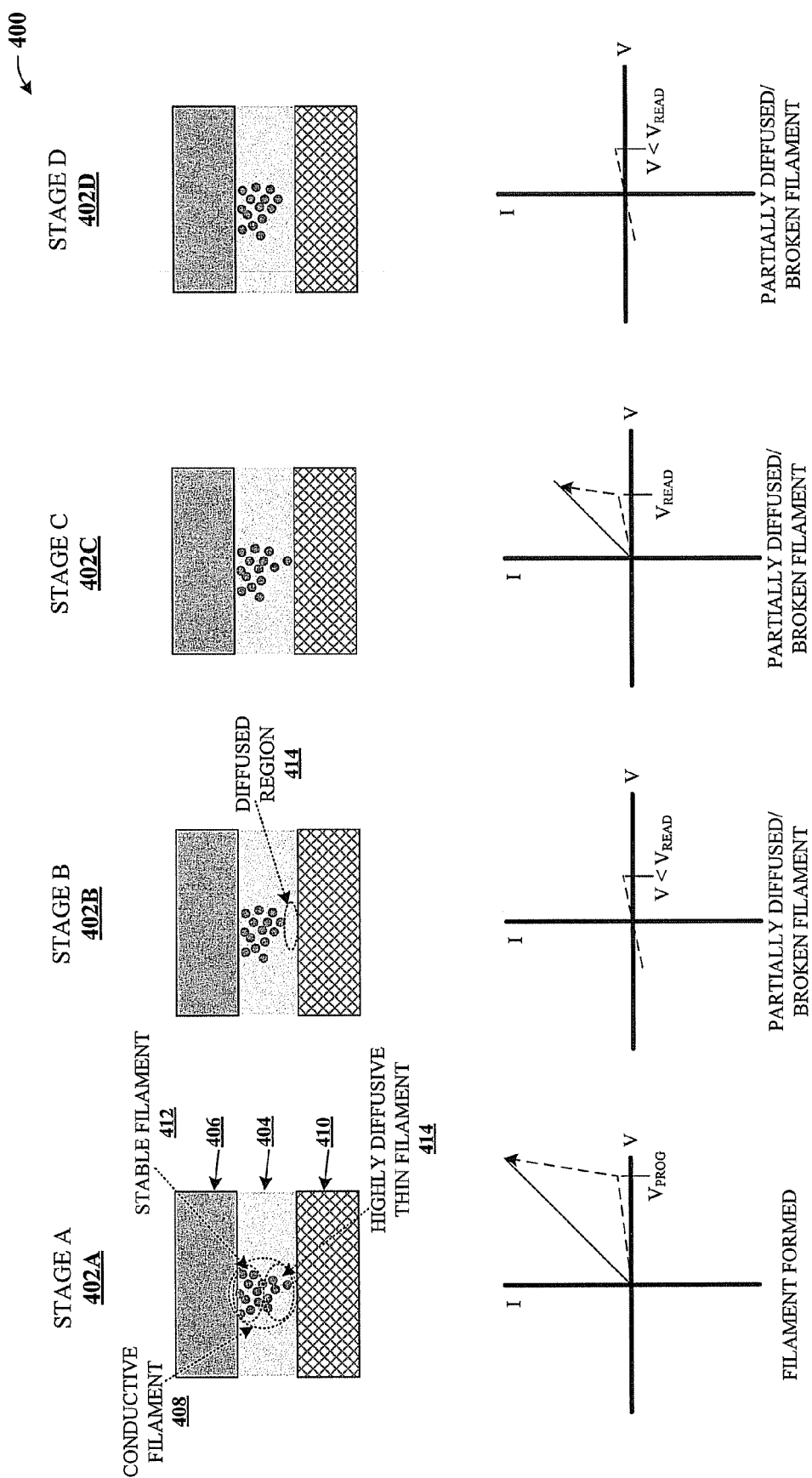
FIG. 4 illustrates a block diagram of a sample filament formation and partial deformation with related current-voltage diagrams.

FIG. 4 depicts a sample diagram illustrating real-time filament formation for a solid state memory cell 400 having rectified resistive switching, according to one or more additional aspects of the subject disclosure. Real-time filament formation for solid state memory cell 400 is depicted in four stages, including stage A 402A, stage B 402B, stage C 402C and stage D 402D (referred to collectively as stages 402A-402D). Respective stages 402A-402D have corresponding current-voltage diagrams associated therewith below the respective memory cell stack diagrams.

Referring to stage A 402A, solid state memory cell 400 comprises a diffusive layer 404 between an ion layer 406 and a bottom electrode 410. Within the diffusive layer 404, a conductive filament 408 is formed from ions of ion layer 406. Note that the conductive filament 408 is depicted as having two segments: a stable filament 412 near ion layer 406 and a highly diffusive thin filament 414 near bottom electrode 410. As depicted by the current-voltage diagram below the layer stack diagram of stage A 402A, a bias applied to solid state memory cell 400 at stage A 402A is about equal to a program voltage, yielding a corresponding large program current.

Referring now to stage B 402B, a diffused region 414 has developed in diffusive layer 404. This diffused region 414 is characterized by a lack of sufficient ions to maintain electrical continuity compared with conductive filament 408. Accordingly, as depicted at the corresponding current-voltage chart of stage B 402B, current through solid state memory cell 400 is very small, on the order of an erase or "off" current. Note that a voltage across solid state memory cell 400 at stage B 402B is less than a read voltage, $V_{READ}$. In this context $V_{READ}$ is substantially equal to the reformation voltage or rectifier voltage described herein.

Referring now to stage C 402C, conductive filament 408 is reformed, similar to stage A 402A. Note that the conductive filament 408 is formed at a significantly lower voltage, $V_{READ}$, than the program voltage applied at stage A 402A. Despite this much lower voltage, current through solid state memory cell 402C is still much higher than at stage B 402B. This much larger current is generally of multiple orders of magnitude, and can provide significant sensing margin to distinguish a program state of stage C 402C versus a an "off" stage (not depicted—but having similar current as at stage B 402B).

Referring now to stage D 402D, reducing the bias at solid state memory cell 400 reforms diffused region 414. This results, as described above, by dropping the bias below $V_{READ}$ as depicted at the corresponding current-voltage diagram of stage D 402D. Similar to stage B 402B, solid state memory cell 400 has very small current at stage D 402D.

It is worth noting that solid state memory cell 400 is in a program or "on" state for all stages of FIG. 4, despite the significant difference in current flowing through the cell. At least for positive voltages, solid state memory cell 400 mimics the rectifier characteristics of a resistor in series with a diode component. At low positive voltage below a threshold voltage (in this case lower than $V_{READ}$), very small current flows through solid state memory cell 400. As the positive voltage increases above the threshold voltage, conductive filament 408 is reformed and a much larger program current flows through solid state memory cell 400. To contrast the program state depicted by FIG. 4, an erase state or "off" state is characterized by the low current even at $V_{READ}$. More particularly, the erase state or "off" state is characterized by the low current for positive voltages less than Vprogram.

Figure 5:
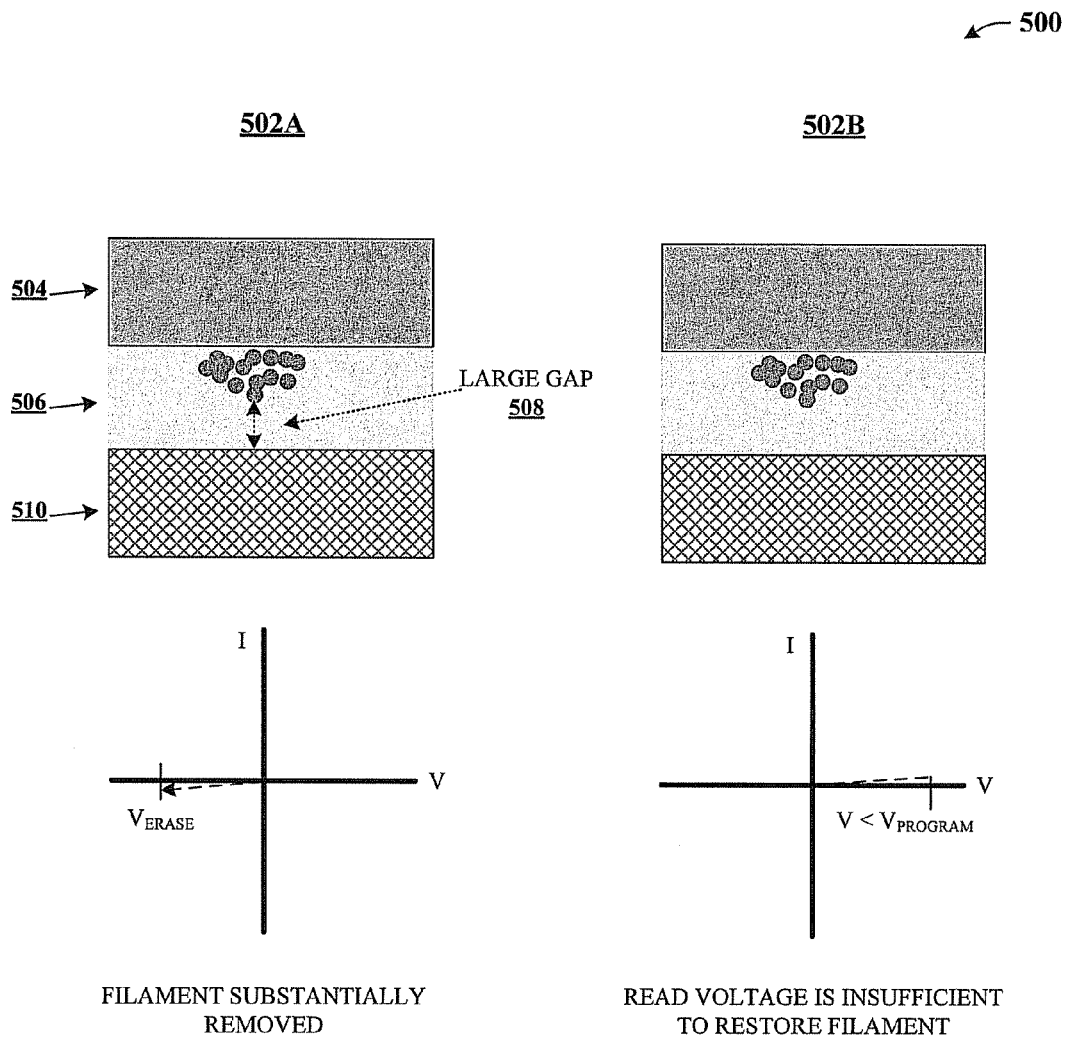
FIG. 5 depicts a block diagram of a sample erase process for solid state memory cells described herein, according to one or more additional aspects.

FIG. 5 illustrates a block diagram of an example rectifier-switched solid state memory cell 500 in an erase or "off" state, according to one or more additional aspects of the subject disclosure. Solid state memory cell 500 is depicted in two stages, stage A at 502A and stage B at 502B. Corresponding current-voltage diagrams are depicted below the memory cell stack diagrams of the respective stages 502A, 502B.

At stage A 502A, solid state memory cell 500 comprising an ion layer 504 adjacent to a diffusive layer 506. In addition, diffusive layer 506 comprises conductive ions with a relatively large gap 508 between a bottom electrode 510 and the closest conductive ions within diffusive layer 506. This large gap 508 can be produced by a negative erase voltage $V_{ERASE}$ of suitable negative magnitude. The current through solid state memory cell 500 is very small due to the break in electrical continuity of the conductive ions between ion layer 504 and bottom electrode 510, as depicted at the current-voltage diagram of stage A 502A.

At stage B 502B, solid state memory cell 500 maintains substantially the same large gap 508 for voltages equal to a read voltage of solid state memory cell 500. In at least some aspects, large gap 508 can be substantially maintained for voltages less than about a program voltage of solid state memory cell 500. Accordingly, solid state memory cell 500 exhibits very small current at the read voltage (compared, e.g., to a solid state memory cell in a program state as depicted at FIG. 4, supra). This characteristic provides large sensing margin to distinguish erase and program states of solid state memory cell 500.

Figure 6:
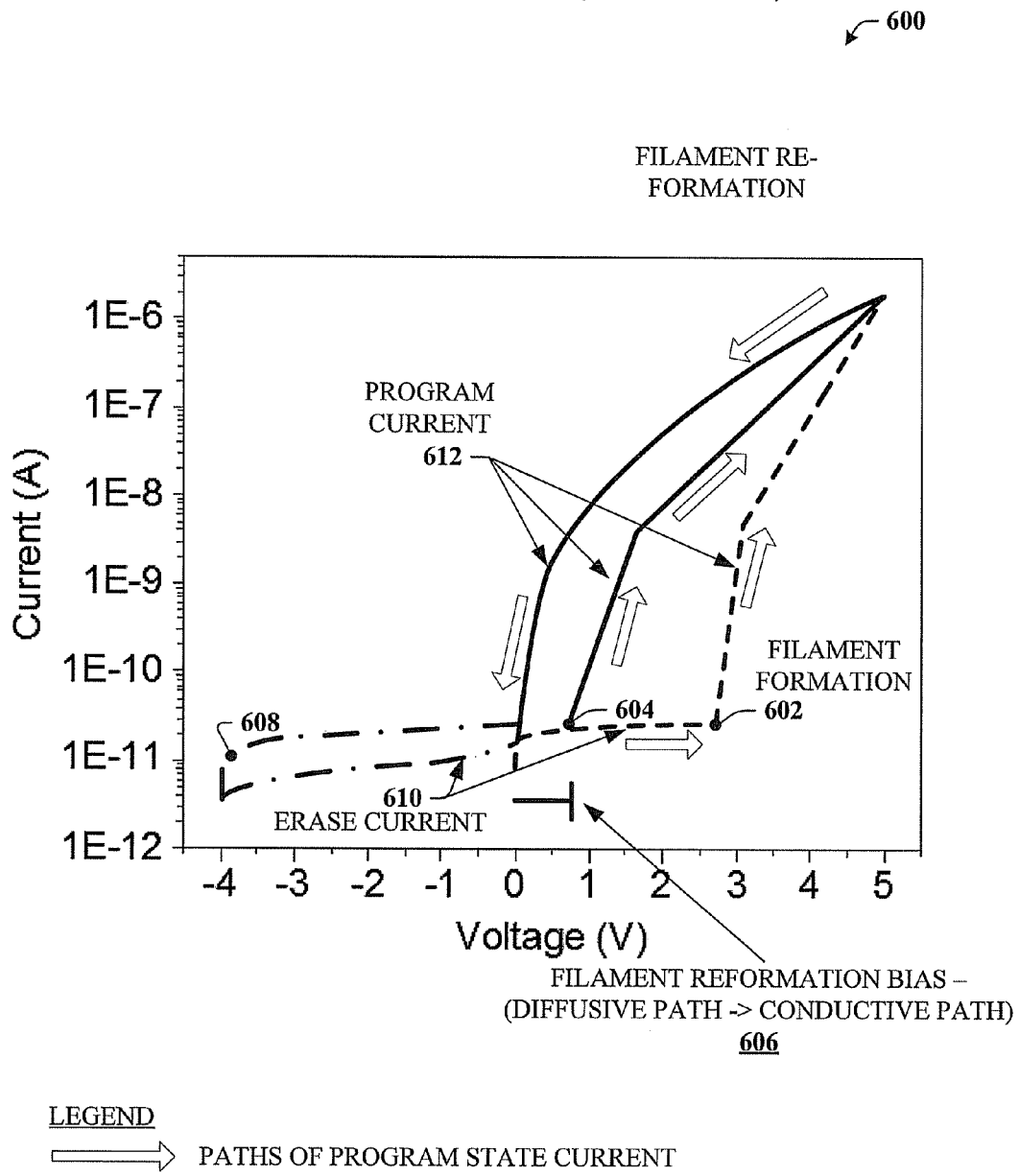
FIG. 6 depicts a diagram of an example current-voltage relationship for solid state memory according to various aspects of the subject disclosure.

FIG. 6 depicts a diagram of aggregate current-voltage characteristics 600 of a rectified-resistive switching solid state memory cell according to various aspects of the subject disclosure. The aggregate current-voltage characteristics 600 include respective characteristics for program and erase operations of the solid state memory cell, as well transitions there between, and for a read operation. Additionally, the current-voltage characteristics include a positive voltage rectification characteristic as described herein.

Beginning at zero volts in an erase state, voltage can be increased with minimal change in current until conductive filament formation 602 occurs for the solid state memory cell. This segment of the current-voltage path is depicted by the dashed lines from about zero volts to just under about three volts. Following conductive filament formation 602, current increases rapidly with relatively small increases in voltage (dashed line beyond filament formation 602), up to about several microamps at five volts. Upon decreasing voltage from five volts back to zero volts, current rapidly decreases to about $10^{-11}$ amps (solid line with downward arrows).

As illustrated in FIG. 6, as voltage increases again from zero following conductive filament formation 602, current increases only by small amounts until filament reformation 604 at about 0.7 volts. This voltage of 0.7 volts is referred to as a reformation bias or rectifier bias 606, in which a diffusive path within the solid state memory cell is transformed into the conductive filament. Once the conductive filament is reformed at about 0.7 volts, current again increases rapidly (solid line with upward arrows at greater than about 0.7 volts). This rectifier bias 606 provides significant benefits in mitigating or avoiding sneak path currents in a crossbar architecture of the solid state memory cell (e.g., see FIG. 7, infra). For instance, where a small voltage potential at a non-selected cell resulting from a read voltage at a neighboring cell occurs, this small voltage potential generates a sneak path current multiple orders of magnitude smaller than a legitimate read current. Moreover, additional circuitry (e.g., additional transistors) is not required to produce this large difference in sneak path current and read current.

In an erase state, the solid state memory cell exhibits an erase current 610. In the erase state, current is between about $0.5 \times 10^{-11}$ amps at about negative four volts and about $2 \times 10^{-11}$ amps at less than about positive 2.8 volts in this particular example. Program current 612 is depicted after conductive filament formation 602, including program current following conductive filament formation 602, read current following filament reformation 604, and reduction in current from about five volts, as depicted. To change the program state to the erase state, a negative voltage of about four volts can be applied to the solid state memory cell (alternating dashed and dotted line for voltages less than zero volts), resulting in substantial filament deformation 608. Following substantial filament deformation 608, current in the solid state memory device follows erase current 610 (both dashed and dotted line below about zero volts, and dashed line above zero volts) until conductive filament formation 602 reoccurs at the program voltage of about positive 2.8 volts.

Figure 7:
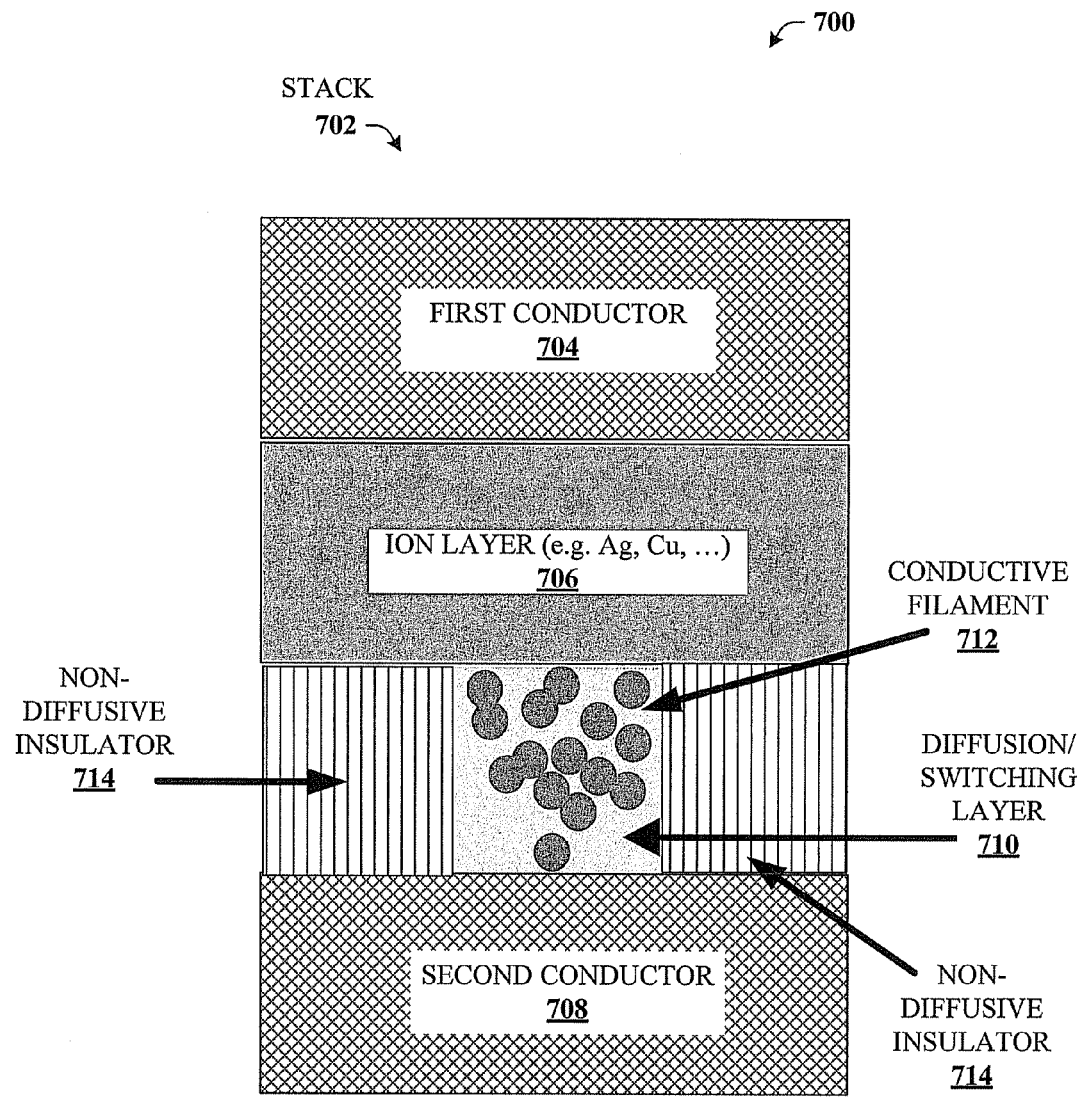
FIG. 7 illustrates a diagram of an example solid state memory cell having a regulated diffusion region according to some aspects.

FIG. 7 illustrates a block diagram of an alternative solid state memory cell 700 according to alternative or additional aspects of the subject disclosure. Solid state memory cell 700 can be a rectified resistive switching device that mitigates leakage current in a solid state memory array. Moreover, solid state memory cell 700 can control ion drift in a diffusive layer of the solid state memory cell 700, providing long-term stability for the rectified switching operations of the solid state memory device 700.

Solid state memory cell 700 can comprise a semiconductor-based stack 702. Stack 702 can form a memory cell capable of storing a digital bit of information. Many iterations of stack 702 within a suitable memory array or memory architecture can facilitate formation of a memory module, such as a FLASH module, a RAM module, or the like.

Stack 702 can comprise a first conductor 704 and a second conductor 708 on opposite ends of stack 702. Between first conductor 704 and second conductor 708 is an active region of solid state memory cell 700. The active region comprises an ion layer 706 adjacent to a diffusion/switching layer 710 (square-checked shading in the central region). In response to a suitable positive voltage applied at first conductor 704 relative to second conductor 708, a conductive filament 712 is formed within diffusion/switching layer 710, as depicted by the collection of gray-shaded circles within diffusion/switching layer 710. Respective ions of conductive filament 712 can be maintained relatively stable in location—at least in the aggregate—while the positive voltage (e.g., a program voltage) is maintained. But as the positive voltage decreases in magnitude, the ions begin to drift within diffusion/switching layer 710. This can break electrical continuity of conductive filament 712 resulting in a diffusive path, as described herein.

In addition to the foregoing, stack 702 can comprise a non-diffusive insulator 714 that is relatively non-permeable to conductive ions of ion layer 706. Non-diffusive insulator 714 (shaded with vertical lines) can be doped to increase density of the non-diffusive insulator 714 relative to diffusion/switching layer 710, in one aspect. In other aspects, high density oxide or tetraethyl orthosilicate (TEOS) can be provided for the non-diffusive insulator 714, to increase the relative density, or the like, or a combination of the foregoing.

Non-diffusive insulator 714 can be formed so as to circumscribe diffusion/switching layer 710, resulting in a relatively thin diffusive channel between ion layer 706 and second conductor 708 within which conductive ions of ion layer 706 are bound by the non-diffusive insulator 714. This can mitigate the conductive ions from diffusing too far throughout diffusion/switching layer 710 so as to make reforming conductive filament 712 out of a diffused filament (e.g., diffused path 314 of FIG. 3, supra) more reliable over time. One potential problem with ion drift within diffusion switching layer 710 is that ions may drift to such a degree that a conductive filament 712 can no longer be formed out of the diffused filament at a pre-determined rectifier/re-formation voltage. In such case, the resistive switching mechanism can be subverted by this degree of ion drift. Where the conductive filament 712 can no longer be formed even at a read voltage, memory loss can result. Thus, by limiting the volume within which conductive ions of conductive filament 712 are able to drift, the degree of drift can be limited as well. In turn, by limiting the degree of drift, the degree of deformation of the conductive filament 712 can be controlled to mitigate subversion of the resistive switching mechanism of solid state memory cell 700.

In particular aspects of the subject disclosure, diffusion/switching layer 710 or non-diffusive insulator 714 can have one or more of the following dimensions. In at least one aspect, diffusion/switching layer 710 can have a width between about 5 nanometers (nm) and about 50 nm. In a further aspect, diffusion/switching layer 710 can have a width between about 5 nm and about 100 nm. In one or more other aspects, non-diffusive insulator 714 can have a width between about 5 nm and about 50 nm. In yet other aspects, non-diffusive insulator 714 can have a height between about 5 nm and about 100 nm. In some aspects, diffusion/switching layer 710 and non-diffusive insulator 714 can be selected to have a similar height, or a similar width. In other aspects, diffusion/switching layer 710 and non-diffusive insulator 714 can be selected to have at least one dissimilar dimension.

Figure 8:
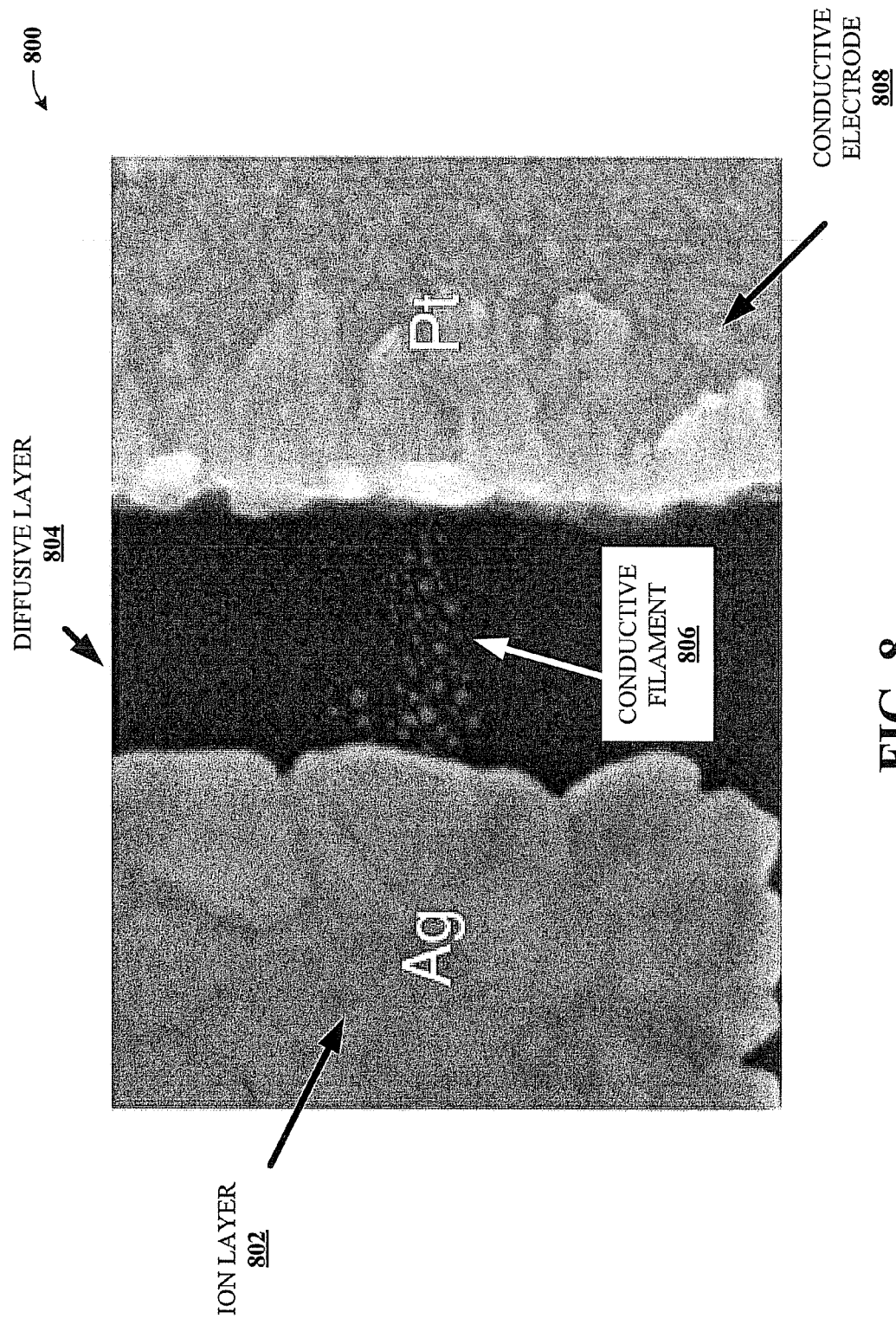
FIG. 8 illustrates an example filament formation for an example solid state memory cell in one or more aspects of the subject disclosure.

FIG. 8 depicts a diagram of a pictorial representation of a solid state memory cell 800 according to a particular aspect of the subject disclosure. Solid state memory cell 800 comprises an ion layer 802 made of silver, and a conductive electrode 808 made of platinum. Between ion layer 802 and conductive electrode 808 is a diffusive layer 804 that can be a-Si, silicon dioxide, chalcogenide, or other suitable material at least in part permeable to silver ions of ion layer 802. The pictorial representation also illustrates a conductive filament 806 formed of silver ions extending from ion layer 802 through diffusive layer 804 to conductive electrode 808. Conductive filament 806 facilitates a conduction path through diffusive layer with a conductivity multiple orders of magnitude greater than conductivity of diffusive layer 804. This conductive filament 806 is formed in response to a suitable program voltage applied across the ion layer 802 and conductive electrode 808.

As is readily discernable by the pictorial representation of FIG. 8, conductive filament 806 comprises a relatively large cross section near ion layer 802, and a relatively small cross section near conductive electrode 808. The large cross section forms a generally stable filament segment, whereas the small cross section forms a generally unstable filament segment. This unstable filament segment facilitates rectifier-based switching of solid state memory cell 800 as described herein. Particularly, partial deformation of the unstable filament segment—sufficient to substantially reduce electrical continuity between ion layer 802 and conductive electrode 808 on an order of multiple orders of magnitude—can occur in response to reduction in voltage across the solid state memory cell 800. A non-zero positive voltage required to reform the conductive filament 806 from the unstable filament segment provides a rectification characteristic for solid state memory cell 800. This rectification characteristic can significantly reduce sneak path currents in a memory cell array as a result of inadvertent voltages smaller than the non-zero positive voltage required to reform the conductive filament 806.

Figure 9:
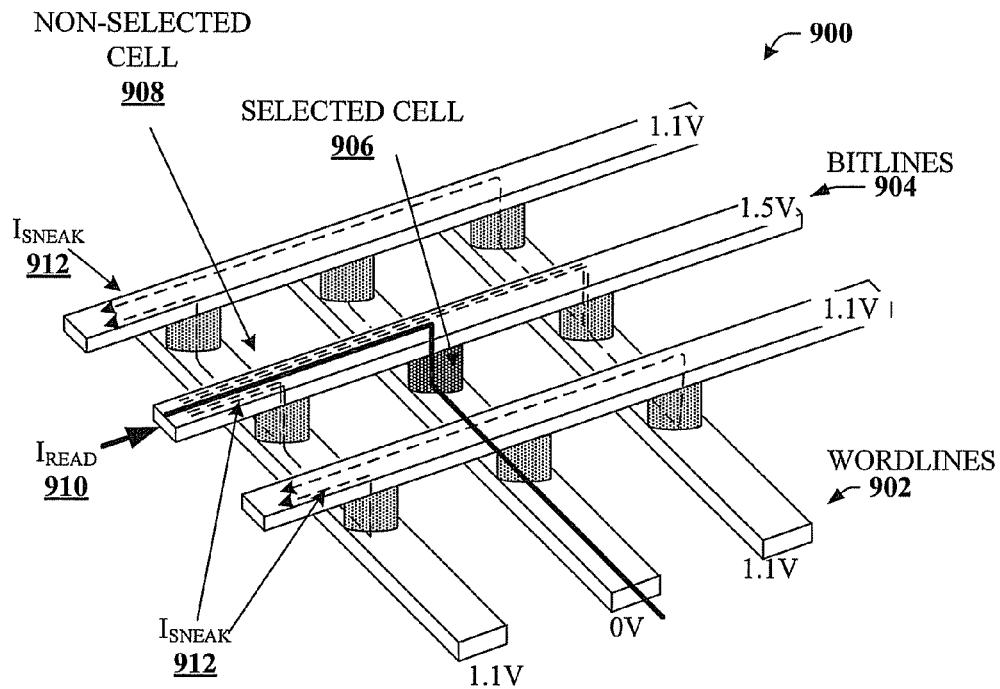
FIG. 9 depicts a block diagram of an example crossbar memory cell array and leak path currents that can be mitigated by disclosed rectified switching.

Turning now to FIG. 9, system 900 is depicted. System 900 is an example memory comprising an architecture of a crossbar array of two-terminal memory cells. System 900 is used to illustrate practical distinctions between memory cells that mitigate sneak path current in a program state versus memory cells that have much higher sneak path current in the program state. Thus two different scenarios are presented. In both cases, system 900 includes various wordlines 902 and bitlines 904 in which a single cell among the array can be selected based upon an applied bias between a particular wordline 902 and a particular bitline 904 with the selected cell representing the junction. In both example scenarios discussed below, the selected cell, cell 906, is in the "off" state while cell 908, as well as all other neighbors of cell 906, are in the "on" state. Further assume that the applied bias (e.g., read voltage) is 1.5 V and this corresponds with an associated read current 910 for a cell in the "on" state of about 15 nano amps (nA) (e.g., referring to the current-voltage diagram of FIG. 6, infra), but of a significantly lower value if the cell in is the "off" state (e.g., about 0.02 nA at about 0.6 volts or less).

It is understood that different bitlines 904 observe small differences in voltage (e.g., resulting from differences in the program pattern in the array). For instance, the middle bitline connected to selected memory cell 906 (dark shading) experiences a read voltage of 1.5 volts, whereas the top and bottom wordlines connected only to un-selected memory cells 908 (all lightly shaded cells) experience 1.1 volts. This difference of 0.4 volts can result in several sneak path currents 912 throughout memory architecture 900, depicted by the dashed lines.

As described herein, a read operation generally involves measuring or sensing a magnitude of a current flowing through a selected memory cell in response to application of a read voltage to that selected memory cell. A read current, $I_{READ}$ 910 is depicted by a bold line, following a read path through the middle bitline 904, through selected memory cell 906, and out the middle wordline 902. However, a magnitude of $I_{READ}$ 910 will add with other currents along the read path, including the sneak path currents 912 (depicted by the dashed lines). Thus, sneak path currents along wordlines 902 and bitlines 904 can add to (or subtract from, depending on polarity) the magnitude of $I_{READ}$ 910, distorting its value. For instance, if the net effect of the sneak currents is to increase $I_{READ}$ 910 by several nA, then a loss of several nA of sensing margin is observed at memory architecture 900. This can negatively impact data integrity and performance of the read operations of two-terminal memory cells of memory architecture 900. Moreover, if sneak currents net to increase $I_{READ}$ 910 on the order of about 15 nA, then the selected cell (cell 906), which is in the "off" state and therefore should have a read current 910 several times lower, might actually be sensed as being in the "on" state.

Thus, in a first case, consider the crossbar array of system 900 is populated with memory cells that have little to no sneak path current mitigation. In that case, read current 910 of about 15 nA flows through cell 906 and sneak path currents 912 are produced. Assuming a substantially linear current-voltage relationship for these cells, the individual magnitudes of these sneak path currents is approximately 4 nA (e.g., if 1.5 V produces 0.1 nA then, linearly, 0.4 V produces about 4 nA). Hence, even though cell 906 is in the "off" state, cell 908 can observe a significant current flow.

However, if the current-voltage relationship is rectified at low memory cell voltages, then the magnitudes of these sneak path currents can be significantly reduced. So, in the second case, neighboring wordlines can be floated or driven at 1.1 volts to minimize the voltage across memory cells of these wordlines. Further, consider the crossbar array of system 900 is populated with two-terminal memory cells described herein (e.g., solid state memory cell 200), in which the cell exhibits a non-linear relationship between current and voltage near a rectifier voltage. In that case, a voltage differential of 0.4 V (that produced a sneak current of 4 µA in the linear case) might only produce a sneak current of 0.02 nA. Therefore, when compared to the non-rectified memory cells, the rectified memory cells provide a significantly larger margin for on-off state comparison and lower power consumption.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, and/ or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise a read process, or vice versa, to facilitate programming and reading a semiconductor cell by way of a single process. In addition, it should be appreciated that respective rows of disclosed memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 10:
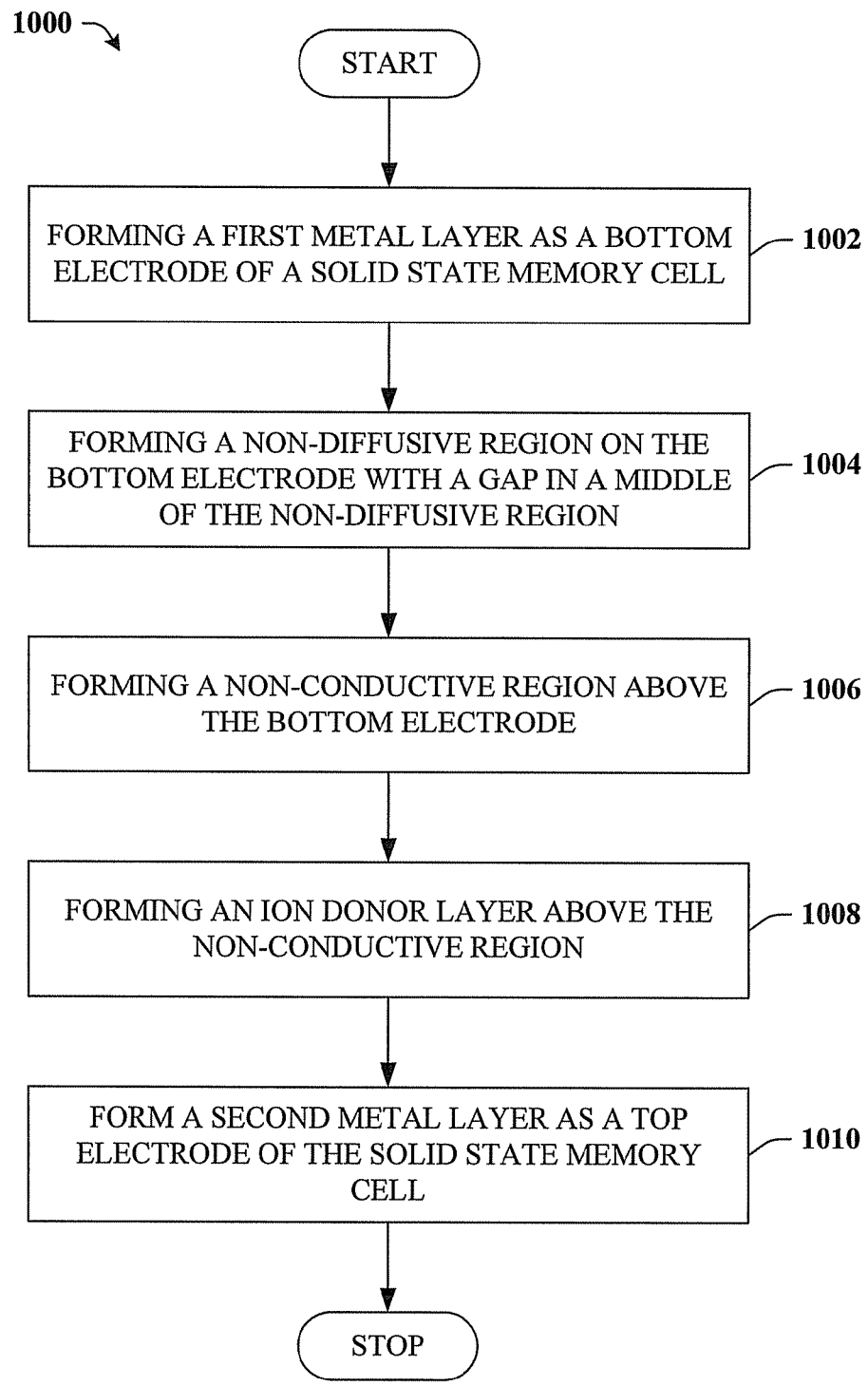
FIG. 10 illustrates a flowchart of a sample method for fabricating a rectified resistive switching solid state memory cell according to particular aspects.

In view of the exemplary diagrams described supra, process methods that can be implemented in accordance with the disclosed subject matter will be better appreciated with reference to the flow chart of FIG. 10. While for purposes of simplicity of explanation, the method of FIG. 10 is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 10 illustrates a flowchart of an example method 1000 for fabricating a memory cell having rectifier-based resistive switching characteristics according to further aspects of the subject disclosure. At 1002, method 1000 can comprise forming a first metal layer as a bottom electrode of a solid state memory cell. At 1004, method 1000 can comprise forming a non-diffusive region on the bottom electrode having a gap in a middle of the non-diffusive region devoid of the non-diffusive material. The non-diffusive region can comprise a high density oxide in some aspects, or a TEOS material in other aspects. At method 1006, method 1000 can comprise forming a non-conductive region above the bottom electrode. In some aspects, the non-conductive region can be formed in the gap in the middle of the non-diffusive region above the bottom electrode. Further, it should be appreciated that method 1000 can comprise selecting a material for the non-conductive region that is at least in part permeable to one or more types of conductive ions. Note that the non-diffusive region can comprise a material that is not permeable or far less permeable to the conductive ions. At 1008, method 1000 can comprise forming an ion donor layer above the non-conductive region, wherein the ion donor layer is comprised of at least one of the one or more types of conductive ions. Further, the ion donor layer can be formed adjacent to the non-conductive region so that ions of the ion donor layer can form a conductive filament through the non-conductive region (e.g., within the gap of the non-diffusive region, in some disclosed aspects) in response to a program voltage applied to the memory cell. Further, the non-conductive region can be formed of a diffusive material facilitating diffusion of the conductive filament in response to reduction in the program voltage, enabling a substantial reduction in electrical continuity of the conductive filament near the bottom electrode. Where the non-conductive region is formed in the gap of the non-diffusive region, the high density non-diffusive region can serve to provide a physical barrier preventing or mitigating movement of the conductive ions out of the gap in the non-diffusive region. This can serve to limit an amount of diffusion of the conductive filament. Method 1000 can further comprise, at 1010, forming a second metal layer as a top electrode of the solid state memory cell.

Figure 11:
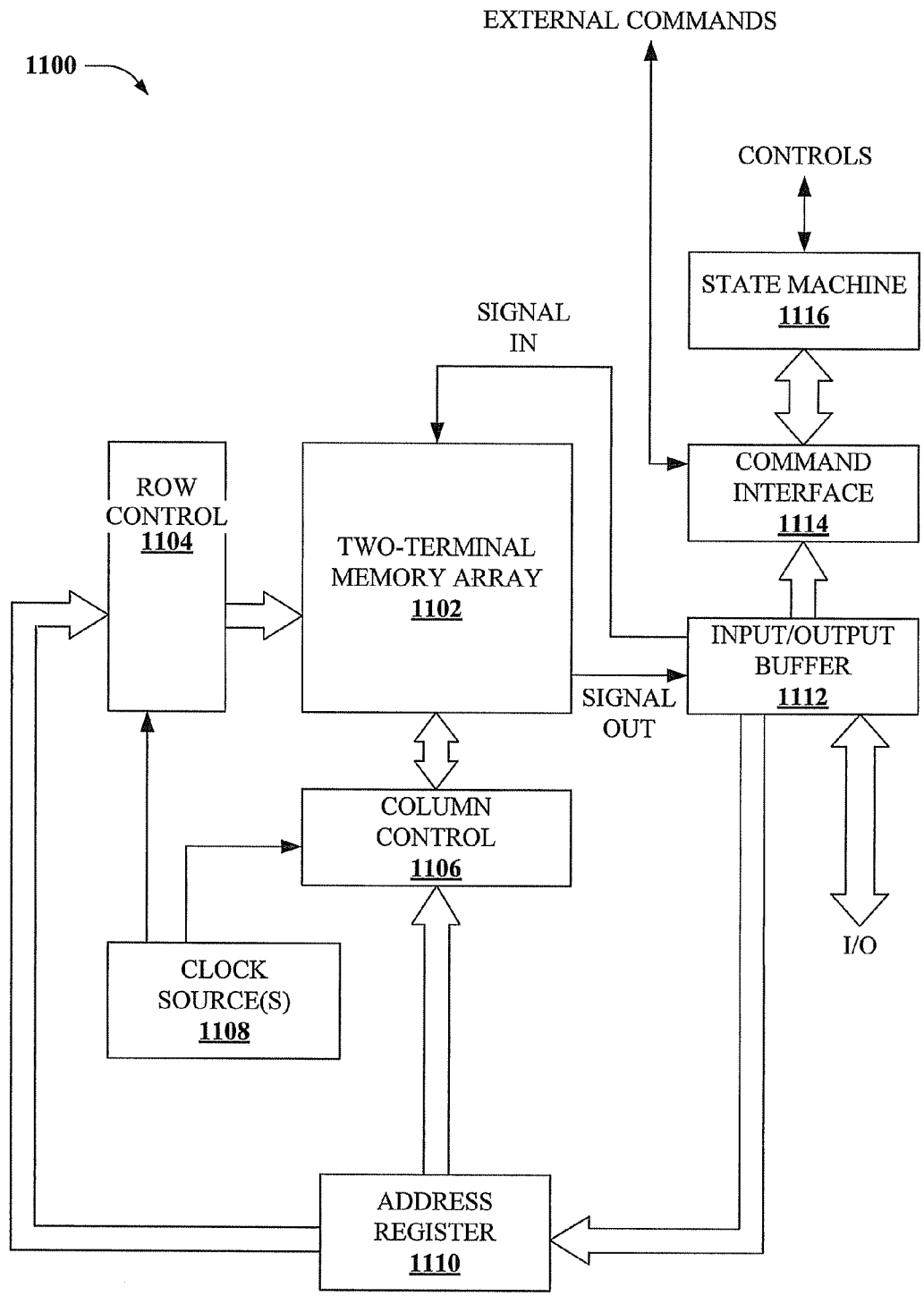
FIG. 11 depicts a block diagram of an example electronic control environment for an array of memory cells according to further disclosed aspects.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a memory array 1102 according to aspects of the subject disclosure. In at least one aspect of the subject disclosure, memory array 1102 can comprise a variety of memory cell technology. Particularly, memory array 1102 can be configured or operated to mitigate or avoid sneak path currents of the memory array 1102, as described herein.

A column controller 1106 can be formed adjacent to memory array 1102. Moreover, column controller 1106 can be electrically coupled with bit lines of memory array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of memory array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to memory array 1102 via signal input lines, and output data is received from memory array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of memory array 1102. State machine 1116 receives commands from the host apparatus via input/output interface 1112 and command interface 1114, and manages read, write, erase, data input, data output, and like functionality associated with memory array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
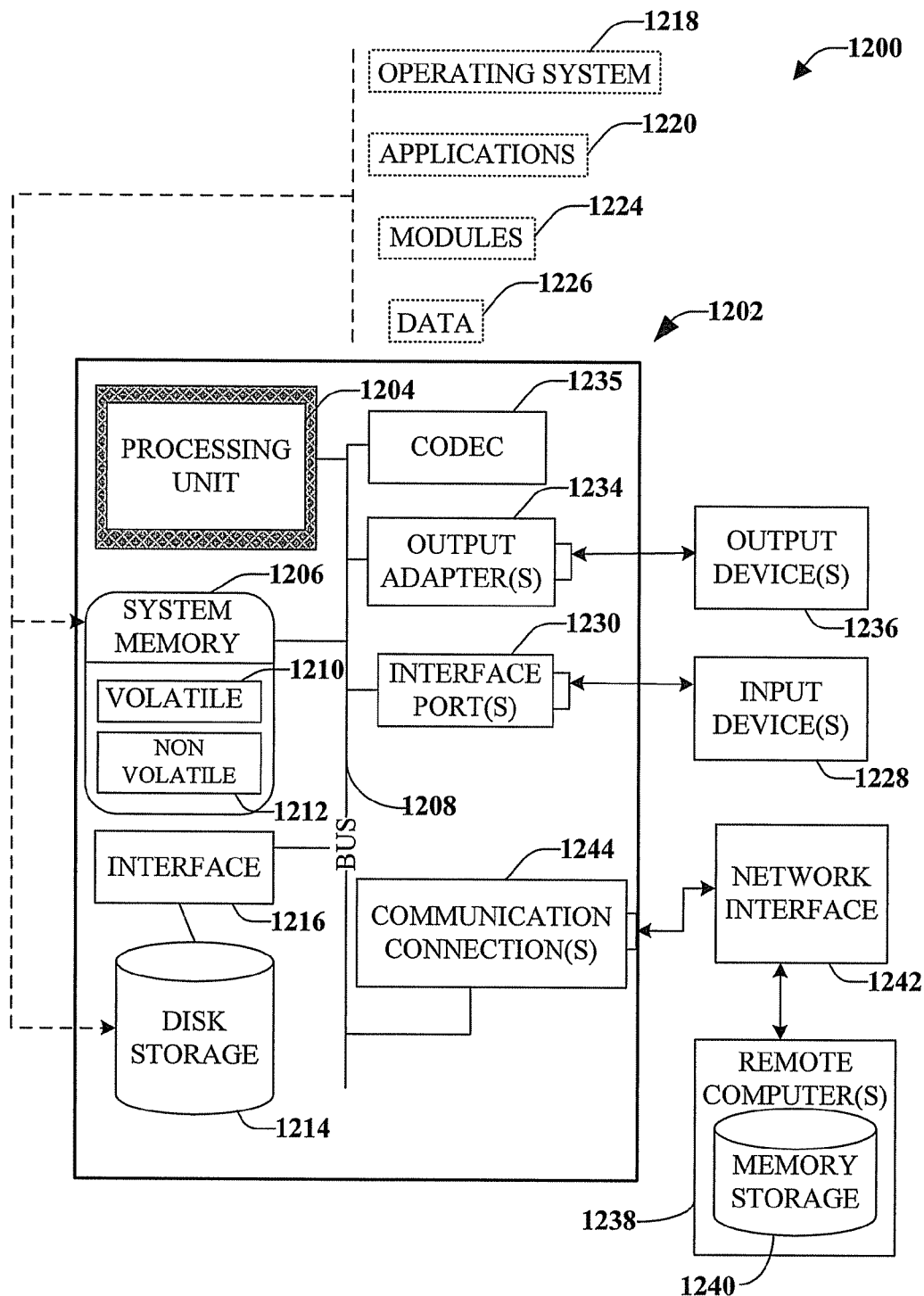
FIG. 12 illustrates a block diagram of an example operating environment for facilitating implementation of one or more aspects disclosed herein.

With reference to FIG. 12, a suitable environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or flash memory. Volatile memory 1210 includes random access memory (RAM), which acts as external cache memory. According to present aspects, the volatile memory may store the write operation retry logic (not shown in FIG. 12) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1202 may also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1214 to the system bus 1208, a removable or non-removable interface is typically used, such as interface 1216. It is appreciated that storage devices 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application. The user can be provided the opportunity to opt-in or opt-out of having such information collected and/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:
1. A solid state memory cell, comprising:
a first electrical conductor that forms a layer of the solid state memory cell;
an electrically resistive diffusive medium that forms a second layer of the solid state memory cell; and
a second electrical conductor that forms a third layer of the solid state memory cell; wherein:

ions of the first electrical conductor are at least in part mobile within the electrically resistive diffusive medium, a conductive path is formed through the diffusive medium between the first electrical conductor and the second electrical conductor in response to application of an electric field across the diffusive medium, and the conductive path partially diffuses within the diffusive medium forming a diffused path in response to a decrease in magnitude of the electric field, the diffused path having an electrical resistance substantially higher than that of the conductive path.

2. The solid state memory cell of claim 1, wherein the diffused path and the electrically resistive diffusive medium have substantially equivalent electrical resistance.

3. The solid state memory cell of claim 1, wherein the conductive path further comprising:

a stable region having a relatively high density of the ions; and a semi-stable region having a relatively low density of the ions.

4. The solid state memory cell of claim 3, wherein the semi-stable region comprises a relatively thin filament of conductive ions facilitating electrical conductivity to the second electrical conductor within the diffusive medium.

5. The solid state memory cell of claim 3, wherein the semi-stable region is at least in part unformed, breaking the conductive path and yielding the substantially higher electrical resistance of the diffused path relative to the conductive path, in response to the decrease in magnitude of the electric field.

6. The solid state memory cell of claim 3, wherein:

the semi-stable region partially deforms, producing the diffused path from the conductive path, in response to the electric field dropping below a reformation voltage; and the semi-stable region reforms, substantially re-creating the conductive path out of the diffused path, in response to the electric field increasing above the reformation voltage.

7. The solid state memory cell of claim 3, wherein the semi-stable region is substantially unformed in response to a bias voltage of opposite polarity to the electric field, removing a greater portion of the conductive path than is removed in conjunction with forming the diffused path, and further wherein the conductive path is reformed in response to reapplication of the electric field at substantially a programming voltage of the solid state memory cell.

8. The solid state memory cell of claim 1, further comprising a non-diffusive electrical insulator adjacent to the electrically resistive diffusive medium that inhibits diffusion of the conductive path within a volume of the solid state memory cell occupied by the non-diffusive electrical insulator.

9. The solid state memory cell of claim 8, wherein the non-diffusive electrical insulator circumscribes the electrically resistive diffusive medium creating a diffusion region bound by a non-diffusion region, the conductive path being substantially confined to the diffusion region and wherein the non-diffusive electrical insulator can comprise at least one of:

a width selected from between about 5 nanometers (nm) and about 50 nm; or a height selected from between about 5 nm and about 100 nm.

10. The solid state memory cell of claim 1, wherein the electrically resistive diffusive medium is formed of silicon, a silicon compound, an oxide or a chalcogenide that is at least in part porous with respect to the ions of the first electrical conductor.

11. The solid state memory cell of claim 10, wherein the silicon compound is a silicon oxygen compound or a silicon germanium compound.

12. The solid state memory cell of claim 1, wherein the first electrical conductor is comprised of at least one of: silver or copper ions, a silver compound or a copper compound.

13. The solid state memory cell of claim 1, wherein the electrically resistive diffusive layer is selected from a range of about 50 nanometers thick to about 30 nanometers thick.

14. The solid state memory cell of claim 1, having a lateral dimension of about 350 nanometers or less.

15. An electronic device comprising an electronic memory unit, the electronic memory unit comprising one or more arrays of solid state memory cells configured to store digital information, the solid state memory cells comprising:

a pair of electrodes respectively configured to conduct electricity at a first electrical resistance;

an insulator configured to conduct electricity at a second electrical resistance that is two or more orders of magnitude greater than the first electrical resistance; and a semi-stable conductive filament within a portion of the insulator having a low resistance stable state and a high resistance stable state, wherein:

the semi-stable conductive filament is in the low resistance stable state in response to a bias at the pair of electrodes greater than or equal to a reformation bias, and the semi-stable conductive filament is in the high resistance stable state in response to a bias at the pair of electrodes smaller than the reformation bias and greater than zero.

16. The electronic device of claim 15, the semi-stable conductive filament reverts to a stable high resistance state in response to a negative bias, the stable high resistance state having the high resistance in response to a bias less than a program bias greater than the read bias.

17. The electronic device of claim 16, application of the read bias restores the semi-stable conductive filament having the low resistance stable state and the high resistance unstable state.

* * * * *